United States Patent [19]
Urban et al.

[11] Patent Number: 6,108,527
[45] Date of Patent: Aug. 22, 2000

[54] WIDE RANGE MULTIPLE BAND RF POWER DETECTOR

[75] Inventors: Robert R. Urban, Millstone Township, Monmouth County; Andrew E. Youtz, Somerville, both of N.J.

[73] Assignee: Lucent Technologies, Inc., Murray Hill, N.J.

[21] Appl. No.: 08/903,873

[22] Filed: Jul. 31, 1997

[51] Int. Cl.[7] .............................. H04B 17/00; H04B 1/04; H04B 1/38

[52] U.S. Cl. ..................... 455/115; 455/126; 455/552; 455/553

[58] Field of Search ..................... 455/91, 115, 126–128, 455/552–553, 575, 226.01, 74, 75; 330/129, 135–136, 140, 126–127, 133–134

[56] References Cited

U.S. PATENT DOCUMENTS

| | | | |
|---|---|---|---|
| 5,043,672 | 8/1991 | Youn | 330/129 |
| 5,126,686 | 6/1992 | Tam | 455/126 |
| 5,128,629 | 7/1992 | Trinh | 455/126 |
| 5,196,806 | 3/1993 | Ichihara | 455/126 |
| 5,287,555 | 2/1994 | Wilson et al. | 455/126 |
| 5,337,006 | 8/1994 | Miyazaki | 455/126 |
| 5,423,078 | 6/1995 | Epperson et al. | 455/533 |
| 5,530,922 | 6/1996 | Nagode | 455/126 |
| 5,617,060 | 4/1997 | Wilson et al. | 455/239.1 |
| 5,854,971 | 12/1998 | Nagoya et al. | 455/126 |
| 5,859,567 | 1/1999 | Black | 455/127 |
| 5,884,149 | 3/1999 | Jaakola | 455/126 |

*Primary Examiner*—Curtis A. Kuntz
*Assistant Examiner*—George Eng
*Attorney, Agent, or Firm*—Gibbons, Del Deo, Dolan, Griffinger & Vecchione

[57] ABSTRACT

The specification relates to a radio frequency (RF) power detection circuit for multiple frequency bands. One embodiment of the present invention uses semiconductors as power detection sensors and as temperature compensation devices. Multiple power detection sensor current signals each develop a voltage signal across a common load resistor. Similarly, multiple temperature compensation sensor current signals each develop a voltage signal across a second common load resistor. A detector voltage and a temperature compensation voltage are then processed through common amplification circuitry, producing a signal proportional to sensed transmitted power.

22 Claims, 3 Drawing Sheets

WIDE RANGE MULTIPLE BAND RF POWER DETECTOR

FIELD OF THE INVENTION

The present invention relates to the field of RF transmission, and more particularly to power detection circuitry utilized in conjunction with RF transmission.

BACKGROUND OF THE INVENTION

Cellular and Personal Communication Service (PCS) radio devices must precisely control their radio frequency (RF) power output for the dual purposes of conserving device battery capacity in portable devices when low power transmission is permissible and to maintain transmitted power within acceptable regulated limits at all times. The tasks of monitoring and controlling transmitted power is further complicated since RF devices typically transmit over a broad range of output power levels. Furthermore, the portability of these devices expose them to temperature extremes not normally associated with fixed-base equipment. The combination of exposure to environmental temperature extremes with a broad range of transmission power levels causes similarly broad extremes in device case and device internal temperatures. Prior art devices used to monitor transmission power typically employ semiconductor devices, such as diodes, as signal strength detectors. The forward voltage drop in a forward biased diode is temperature dependent, and therefore temperature compensation is typically employed. One method of providing temperature compensation is to forward bias a reference diode to match the steady-state DC operating characteristics of a detector diode when the device is not transmitting. Using a comparator or differential amplifier, with one input terminal receiving a diode detection signal and a second input terminal receiving a diode reference signal, creates similar input temperature based deviations at both amplifier inputs and therefore compensates for the adverse effects of such temperature variations.

The advent of allocation of a PCS communications bandwidth has motivated many communication system manufacturers and designers to investigate methods of incorporating both PCS band transmission and cellular band transmission into one communications device. Design of component circuits should minimize replicated components in each RF band, thereby reducing the overall complexity and cost of the new dual band devices.

SUMMARY OF THE INVENTION

The present invention is a multiple band, temperature compensated RF power detector utilizing common circuit components and switchiess operation between frequency bands. Because the power detection circuit operation is switchless and uses many common circuit components, overall manufacturing costs are lower than a comparable circuit implemented utilizing switches and/or duplicitous components.

One exemplary embodiment of the present invention utilizes forward biased semiconductor detector devices to generate an analog DC power detection signal current component accompanied by a steady-state DC forward bias current component. The forward bias current component is temperature sensitive and therefore, compensation is employed. A matched reference semiconductor is forward biased so as to generate the same steady-state DC forward bias current component present in the detection semiconductor in the matched reference semiconductor. Temperature variations causing steady-state current variations through the detection semiconductor will therefore similarly affect the current generation from the matched reference semiconductor. Current from the detection semiconductor is passed through a detection load resistor generating a detection voltage for use as a first input at a detection amplifier stage. Similarly, current from the matched reference semiconductor is passed through a reference load resistor generating a reference voltage for use as a second input at the detection amplifier stage. The voltages at each of the amplifier stage inputs are attributable to an equivalent temperature dependent portion of steady-state DC forward bias current, and are therefore counterbalanced, thus, current dependency upon temperature is compensated.

The present invention uses a second forward biased detection semiconductor and a second matched forward biased reference semiconductor to sense power variations and compensate for temperature variations at a second RF transmission frequency. The second detection semiconductor current output is directed across the same detection load resistor as is the first detection semiconductor current output. Similarly, the second matched reference semiconductor current output is directed across the same reference load resistor as is the first matched reference semiconductor current output. Common amplification stage components are utilized for processing the detection signal output as well, advantageously reducing the duplication of circuit components, eliminating the need for a switching circuit incorporated within the power detection circuitry, and thereby reducing the overall cost and complexity involved in implementing a dual band, temperature compensated power detection circuit.

In one embodiment of the present invention, the semiconductor devices chosen for detection and temperature compensation are diodes. In another embodiment of the present invention, the circuit is implemented utilizing diode-connected bipolar transistors. Other choices for semiconductor devices are contemplated and would be obvious to those skilled in the art.

In yet another embodiment of the present invention, signal amplification is implemented in two stages. The first amplification stage is a differential amplifier stage. The output of this stage is used as the transmitter power detection signal when either of the dual RF band transmitters is operating at a relatively high power. Because the transmitted power can vary greatly in a PCS or cellular communications device, amplification by one stage alone is inadequate when either band is transmitting at a relatively low power level. Therefore, the output of the first amplification stage is accepted as the input to a second non-inverting amplification stage. The output of the non-inverting amplification stage is utilized when transmitting in either RF band at relatively low power levels. The outputs from a power detection amplification stage are typically utilized at a gain control device, such as a variable gain amplifier (VGA) or a voltage variable attenuator (VVA), within a cellular or PCS device to control the power level of the signal being transmitted. In yet another embodiment of the present invention, the analog DC output from a power detection amplification stage is first converted to a digital signal before being utilized at the gain control device.

BRIEF DESCRIPTION OF THE DRAWINGS

A more complete understanding of the present invention may be obtained from consideration of the following description in conjunction with the drawings in which.

DETAILED DESCRIPTION

Although the present invention is particularly well suited for use within a dual band cellular/PCS phone, and shall be described so with respect to this application, the present invention may also be utilized as a RF power sensor whenever multiple band RF function power monitoring is required. Therefore, although well defined frequency bands are allocated to cellular and PCS frequencies, the present invention is not dependent upon a specific choice, or number, of frequency bands for operation. The present invention is operable whenever transmission of two or more distinct frequency bands, amplified over two or more RF amplifiers, are monitored for their respective power (or signal strength) output. Additionally, although the present invention is further described in terms of digital voice data transmission, it also equally applies to multiple band use within an analog voice transmission environment, such as the advanced mobile-phone service (AMPS) environment, or with a multiple band use encompassing any number of digital or analog frequency bands. The present invention is also fully compatible with implementations which are not multiplexed as well as those implementations that are multiplexed, including, but not limited to, time-division multiple access (TDMA) multiplexing, code-division multiple access (CDMA) multiplexing, Global Systems for Multiple Communications (GSM) multiplexing, and frequency-division multiple access (FDMA) multiplexing, as well as hybrid systems incorporating a combination of multiplexing techniques.

Figure 1:
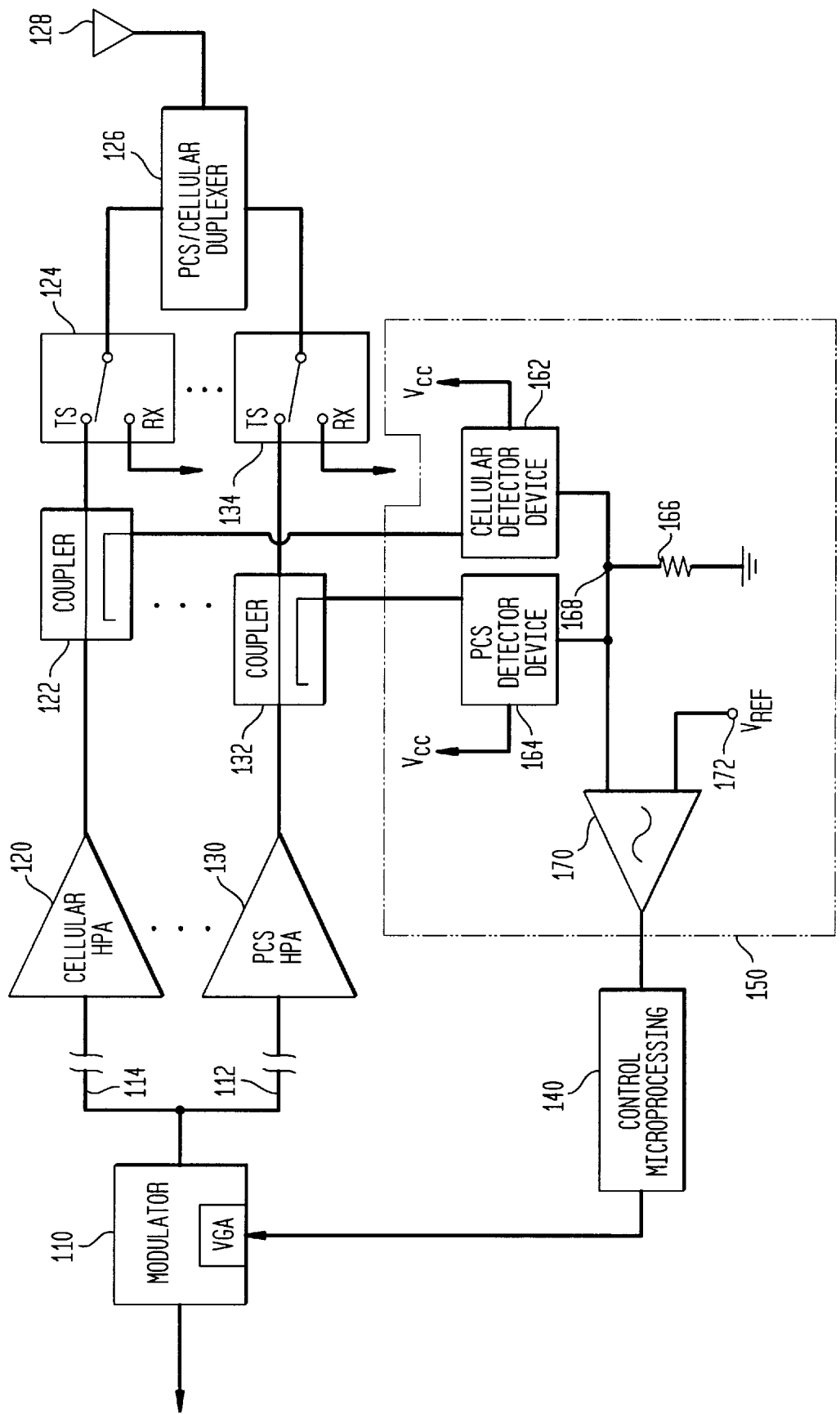
FIG. 1 is a functional block diagram of portions of a multi-band communications device incorporating an exemplary embodiment of the present invention as a dual band power sensing circuit.

FIG. 1 is a functional block diagram of multi-band communications device, incorporating an exemplary embodiment of the present invention as a dual band, cellular and PCS, power sensing circuit 150. FIG. 1 further shows a typical multi-band arrangement of similar high power amplifiers, couplers and detector devices for the processing of more than two frequency bands. One high power amplifier, one coupler and one detector device, are required for each additional frequency band to be processed. The parallel installation of the components of additional frequency band provides the invention with advantageous expansion capabilities. Voice data entering a modulator 110 is modulated at a transmission frequency. The determination as to whether a PCS or a cellular frequency band is used is typically made by the network operator servicing the cellular phone. If modulated at a PCS frequency band, then the signal is processed by a PCS branch 112 which includes a PCS high power amplifier (HPA) 130. If modulated at a cellular frequency band, then the signal is processed by a cellular branch 114 which includes a cellular high power amplifier (HPA) 120. A PCS signal, after being amplified, is passed to a PCS coupler 132 which passes the majority of signal power to a PCS transmit/receive switch 134, then to a PCS/cellular duplexer 126, and ultimately to a dual band antenna 128 for wireless transmission.

A cellular signal, after being amplified, is passed to a cellular coupler 122 which passes the majority of signal power to a cellular transmit/receive switch 124, then to the PCS/cellular duplexer 126, and ultimately to the dual band antenna 128 for wireless transmission. A portion of the PCS signal extracted at the PCS coupler 132 and a portion of the cellular signal extracted at the cellular coupler 122 are inputs to a multiple band power sensing circuit 150.

One embodiment of a multiple band power sensing circuit 150, in its simplest form, is comprised of a plurality of frequency band detector devices 162/164, a load impedance 166 common to each of the plurality of frequency band detector devices, and a power detection signal amplification (PDSA) stage 170. In the embodiment of the present invention illustrated in FIG. 1, only two detector devices are shown, a PCS detector device 164 and a cellular detector device 162, resulting in a dual band power sensing circuit 150. The PCS detector device 164 and the cellular detector device 162 are each operable to detect RF signals when their respective branches are actively transmitting and to convert the RF signal into a rectified DC current proportional to the relative signal strength (transmission power). The rectified DC current proportional to relative signal strength is converted to a voltage signal as one input to the PDSA stage 170 by its voltage drop across the load impedance 166 to ground. The load impedance is typically implemented with the use of a load resistor, since a resistance offers a fixed and invariable impedance through various contemplated RF frequency bands, but should not be construed to be so limited. When neither the PCS HPA 130 nor the cellular HPA 120 are actively amplifying signals, that is neither the cellular band nor the PCS band are transmitting, each detector device produces a steady-state DC current. The PCS detector device 164 and cellular detector device 162 current outputs are coupled together at a common power detection signal node 168. A load impedance 166 is coupled from the common node 168 to ground to develop a detector voltage at the common node 168. The resulting combined current flowing through load impedance 166 produces a standby voltage at the power detection signal node 168 of the PDSA stage 170. This voltage is referred to as the detector DC offset voltage (also known as the steady-state DC bias voltage) when neither the cellular HPA 120 nor the PCS HPA 130 are actively transmitting. A reference voltage (VREF) 172 is selected to approximately match the power detection signal node voltage 168 when no branch is actively transmitting (the DC offset voltage), therefore the output of the PDSA stage 170 is at a minimum when no branch is actively transmitting.

In the dual band embodiment of the present invention, only one of either the PCS branch 112 or the cellular branch 114 transmits during any given period of time. Advantageously, the present invention detects transmission power over either branch through common load components and a common PDSA stage 170 without the need for active or passive switching devices between detectors. For example, if the PCS branch 112 is actively transmitting, then the PCS HPA 130 amplifies the RF signal to be transmitted and the PCS coupler 132 routes a portion of the signal to a PCS detector device 164. The PCS detector device 164 rectifies the RF signal and converts the rectified RF signal to an output DC current proportional to PCS RF signal strength. The output DC current proportional to PCS RF signal strength is passed to ground (thus providing electrical continuity) through a load impedance 166 and results in a power detection signal node 168 voltage equal to the voltage equivalent of the output DC current proportional to the PCS RF signal strength (that component of current attributable to the detection of a PCS RF signal) plus a steady-state component attributable to the detector DC offset bias voltage. Since the $V_{REF}$ 172 is selected to match the DC offset bias voltage, a PDSA stage 170 output signal is proportional, either directly or inversely depending upon the amplification stage amplifier configuration, to the transmitted PCS RF signal strength.

In the alternative, if the cellular branch 114 is actively transmitting, then the cellular HPA 120 amplifies the RF signal to be transmitted and the cellular coupler 122 routes a portion of the signal to a cellular detector device 162. The cellular detector device 162 rectifies the RF signal and converts the rectified RF signal to an output DC current proportional to the cellular RF signal strength. The output DC current proportional to cellular RF signal strength is passed to ground through the load impedance 166 and results in a power detection signal node 168 voltage equal to the voltage equivalent of the output DC current proportional to the cellular RF signal strength (that component of current attributable to the detection of a cellular RF signal) plus a steady-state component attributable to the detector DC offset bias voltage. Since the $V_{REF}$ 172 is selected to match the DC offset voltage, the PDSA stage 170 output signal is proportional, either directly or inversely depending upon the amplification stage amplifier configuration, to the transmitted cellular RF signal strength.

The PDSA stage 170 output is input to a control microprocessor 140, or other similar control device. The control microprocessor 140 signals a variable gain amplifier (VGA) or voltage variable attenuator (VVA), as the initial power sensing feedback stage within the modulator 110, to adjust transmission power in accordance with transmission power requirements. One embodiment of the present invention incorporates an analog to digital (A/D) converter as the initial stage of the control microprocessor 140, therefore, the PDSA stage 170 output is converted from an analog power detection signal to a digital power detection signal.

Figure 2:
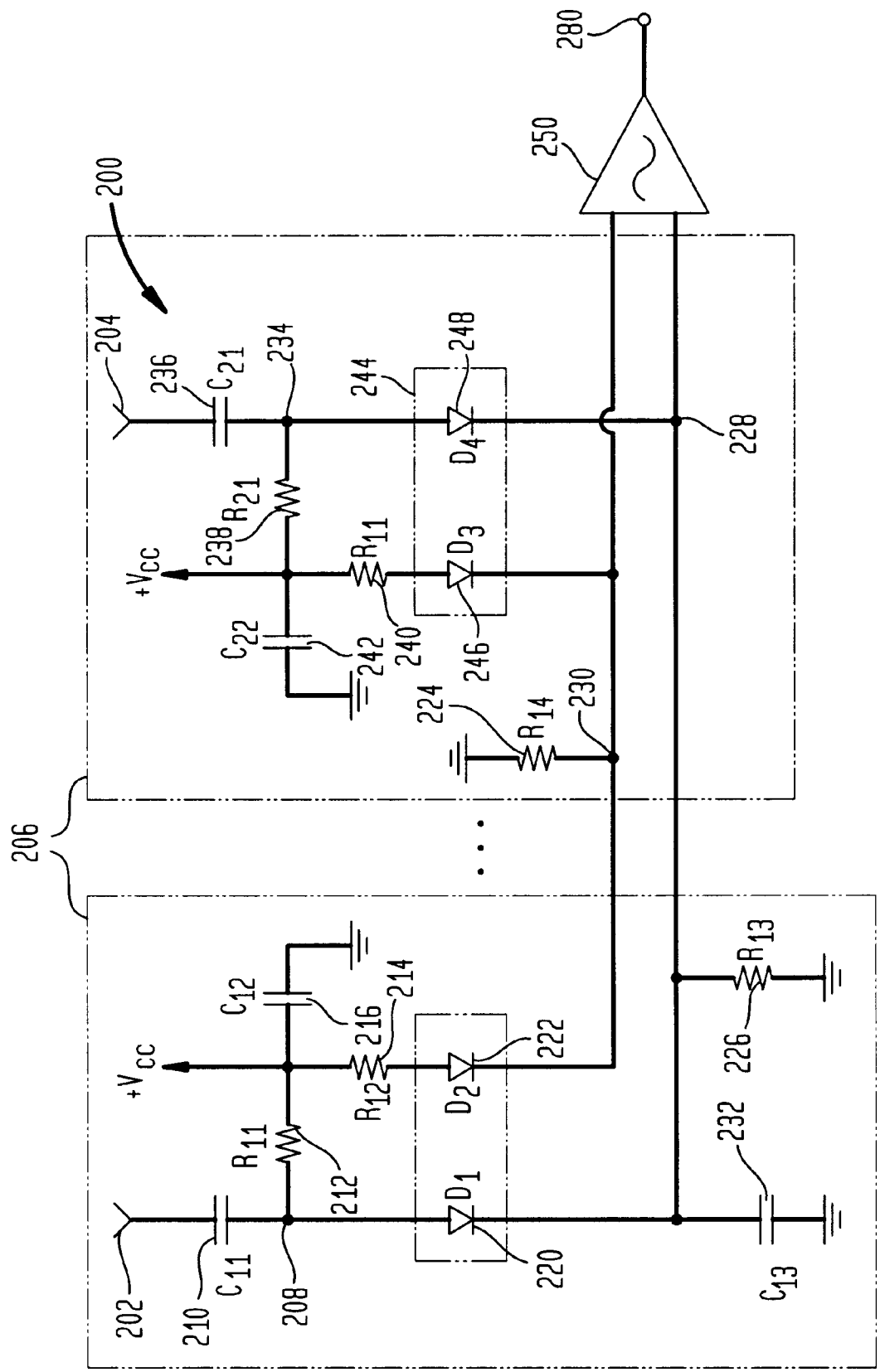
FIG. 2 is a simplified schematic diagram illustrating an exemplary dual-band embodiment of a temperature compensated, wide range, single supply RF multi-band power detector, in accordance with the present invention.

FIG. 2 is a simplified schematic diagram illustrating an exemplary dual-band embodiment of the present invention utilizing matched diode pairs to implement a temperature compensated, wide range, RF multi-band power detector 200. Circuit temperature compensation is achieved through the use of matched set diodes 218, 244, one diode of each matched set is a detector diode 220, 248 through which RF energy is passed and converted to a DC signal while the second diode of each matched set is a reference diode 222, 246. A PCS detection signal input 202 is input to one detection circuit 164 of the dual band circuit and a cellular detection signal input 204 is input to a second detection circuit 162. DC blocking capacitor, $C_{11}$ 210 provides RF coupling to the PCS detection circuit while blocking external DC. $C_{21}$ 236 is the equivalent DC blocking capacitor for the cellular detection circuit. Steady state non-transmission status DC circuit operation is attained by applying a supply voltage, $^+V_{cc}$ 206, in order to forward bias detector and reference diodes $D_1$ 220, $D_2$ 222, $D_3$ 246, and $D_4$ 244. Resistors $R_{11}$ 212 and $R_{21}$ 238 are used to provide RF signal impedance matching. Resistors $R_{12}$ 214 and $R_{22}$ 240 are provided to ensure that the same DC conditions that are established at the anodes of detector diodes $D_1$ 220 and $D_4$ 248 are also established at the anodes of reference diodes $D_2$ 222 and $D_3$ 246. Any RF variations which are present and could possibly be backfed through the voltage supply, $^+V_{cc}$ 206, are passed to ground through RF shunt capacitors $C_{12}$ 216 and $C_{22}$ 242. A DC current established through detector diodes $D_1$ 220 and $D_4$ 248 passes through a load developing resistor, $R_{13}$ 226, to establish a steady-state DC voltage (also known as DC offset bias voltage) at a power detection signal node 228. Any residual RF signal present after rectification via detection diodes $D_1$ 220 and $D_4$ 248 is shunted to ground via RF shunt capacitor $C_{13}$ 232. The power detection signal node 228 is one input to a PDSA stage 250. A DC current established through reference diodes $D_2$ 222 and $D_3$ 246 passes through a reference developing resistor, $R_{14}$ 224, to establish a steady-state DC voltage at the power detection reference node 230. The power detection reference node 230 is a second input to the PDSA stage 250.

In an exemplary dual-band embodiment of the present invention in which the PDSA stage 250 is configured as a differential amplifier, the resistance values chosen for impedance matching resistors $R_{11}$ 212 and $R_{21}$ 238 and current matching resistors $R_{12}$ 214 and $R_{22}$ 240 are equal, and the resistance value of the load developing resistor $R_{13}$ 226 is equal to that of the reference developing resistor $R_{14}$ 224, the steady-state DC voltage at both input terminals of the PDSA stage 250 are approximately equal and therefore the PDSA stage output 280 is a minimum. The PDSA stage 250 provides temperature compensation by algebraically subtracting the steady-state DC voltage present at the power detection reference node 230 from the voltage present at the power detection signal node 228, thus effectively compensating for the voltage component attributable to the DC offset voltage of the detector diodes at the power detection signal node 228. Since DC offset voltage is a temperature dependent value, and since utilization of matched diode pairs equally affects the signal node 228 voltage and the reference node 230 voltage, temperature compensation is achieved.

During a PCS transmission, a signal proportional to PCS transmission signal strength is sensed by a PCS coupler and made available at the PCS detection signal input 202 of the dual band RF power detector 200. The RF signal passes through DC blocking capacitor $C_{11}$ 210. Forward biased PCS detector diode $D_1$ 220 rectifies the RF signal and rectified DC current through $D_1$ results in an additional DC voltage drop across load developing resistor $R_{13}$ 226. The additional DC voltage drop is present at the power detection signal node 228, an input to the PDSA stage 250, and is proportional to PCS signal strength. The signal strength component is amplified by the PDSA stage 250 and the output represents a DC value proportional to sensed PCS signal strength, therefore the PDSA stage output 280 is proportional to PCS transmission power.

Similarly, during a cellular transmission, a signal proportional to cellular transmission signal strength is sensed by a cellular coupler and made available at the cellular detection signal input 204 of the dual band RF power detector 200. The RF signal passes through DC blocking capacitor $C_2$ 236. Forward biased cellular detector diode $D_4$ 248 rectifies the RF signal and rectified DC current through $D_4$ results in an additional DC voltage drop across load developing resistor $R_{13}$ 226. The additional DC voltage drop is present at the power detection signal node 228 input to the PDSA stage 250 and is proportional to cellular signal strength. The signal strength component is amplified by the PDSA stage 250 and the output represents a DC value proportional to sensed cellular signal strength, therefore the PDSA stage output 280 is proportional to cellular transmission power.

Advantageously, an implementation of a multiband RF power sensing detection circuit, in accordance with the present invention, utilizes several shared components for portions of the circuitry common to all RF bands. Individual detection circuits are coupled to a common power detection signal node 228. Signal circuitry downstream from the power detection signal node 228 is not replicated for each individual RF band. Similarly, reference circuitry downstream from the power detection reference node 230 is not replicated for each individual RF band. Furthermore, only a single implementation of a PDSA stage 250 is required, rather than a PDSA stage dedicated to each frequency band.

Figure 3:
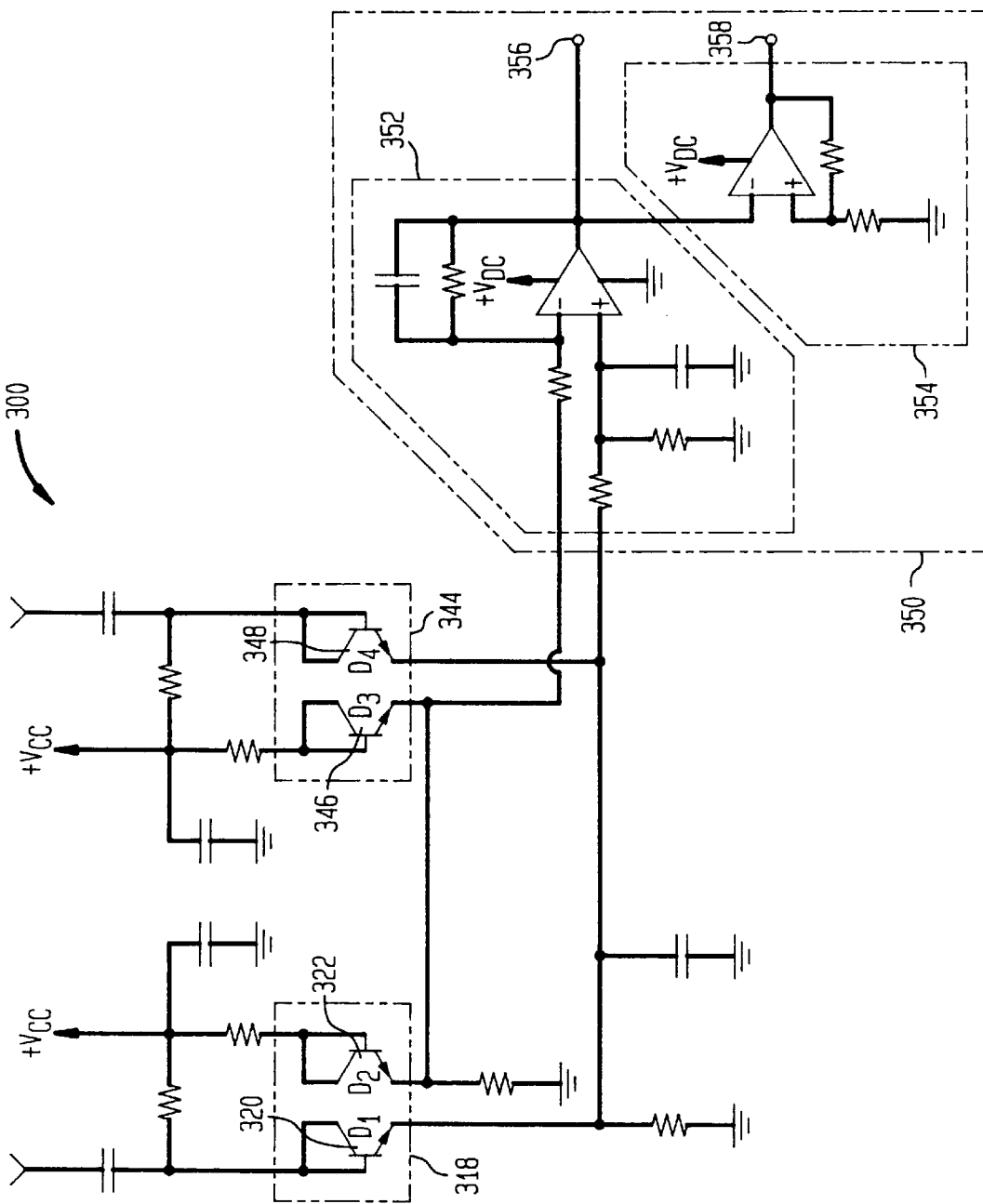
FIG. 3 is a schematic diagram illustrating another exemplary dual-band embodiment of a temperature compensated, wide range, single supply RF dual band power detector, incorporating signal amplification for low RF power output and high RF power output, in accordance with the present invention.

FIG. 3 is a schematic diagram illustrating another exemplary dual-band embodiment of a temperature compensated, wide range RF multi-band power detector, incorporating signal amplification for low RF power output and high RF power output, in accordance with the present invention. Circuit operation and component functions are identical to those described in conjunction with FIG. 2 with the exceptions of an alternative implementation for matched diode pairs 318 and 344 and a more detailed description of an exemplary embodiment of a power detection signal amplification (PDSA) stage 350. Diode-connected transistors are utilized as detector diodes 320 and 348 and as reference diodes 322 and 346 in the present embodiment. The PDSA stage 350 is implemented in two stages; a first stage configured as a differential amplifier 352 and a second stage configured as a non-inverting amplifier 354. The differential amplifier output 356 provides a signal input for the second stage non-inverting amplifier 354. An analog RF power detection signal is available at the differential amplifier output 356 for high-power RF signals and available at the non-inverting amplifier output 358 for low-power RF signals.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention and is not intended to illustrate all possible forms thereof. It is also understood that the words used are words of description, rather than limitation, and that details of the structure may be varied substantially without departing from the spirit of the invention and the exclusive use of all modifications which come within the scope of the appended claims are reserved. For example, many types of semiconductor devices can be utilized as detector diodes and reference diodes since many semiconductors exhibit a similar correlation between DC offset voltage and ambient temperature.

What is claimed is:

1. A multiple band radio frequency (RF) signal detection circuit for detecting signal strength of RF signals at a plurality of frequency bands, said signal detection circuit comprising:

a first detector device producing a first detector signal current, said first detector signal current related to a first RF signal strength at a first frequency band;

a second detector device producing a second detector signal current, said second detector signal current related to a second RF signal strength at a second frequency band;

a load developing impedance for receiving said first detector signal current and said second detector signal current, said load developing impedance converting said first detector signal current to a first detector signal voltage and said second detector signal current to a second detector signal voltage; and an amplifier for providing an amplified output of said first detector signal voltage if a first RF signal is present and an amplified output of said second detector signal voltage if a second RF signal is present.

2. The apparatus in accordance with claim 1 further comprising a third detector device producing a third detector signal current related to a third RF signal strength at a third frequency band, said third detector device being in a parallel configuration to said first detector device and said second detector device.

3. The apparatus in accordance with claim 1 further comprising a plurality of detector devices, in a parallel configuration, producing a plurality of detector signal currents, each of said plurality of detector signal currents respectively related to a plurality of RF signal strengths at a respective plurality of frequency bands, wherein said load developing impedance further receives said plurality of detector signal currents and converts said plurality of detector signal currents to a respective plurality of detector signal voltages, and wherein said amplifier further provides an amplified output of each of said plurality of detector signal voltages when each of a respective plurality of RF signals is present.

4. The apparatus of claim 3 wherein said plurality of detector devices are implemented using a plurality of semiconductor devices.

5. The apparatus in accordance with claim 4 further comprising:

a plurality of reference semiconductor devices, each of said plurality of reference semiconductor devices biased to produce a DC current approximately equal to a DC bias current associated with each of said plurality of detector devices; and a reference developing resistor for receiving said DC current from each of said plurality of reference semiconductor devices and converting said DC current into a reference voltage, wherein said reference voltage is applied as a second input to said amplifier, said reference voltage used to compensate for said DC bias current associated with each of said plurality of detector devices.

6. An apparatus for radio frequency (RF) signal strength detection within a dual frequency band transmitter, said apparatus providing an analog DC output proportional to a relative signal strength of a first RF signal if said first RF signal is being transmitted, said apparatus providing an analog DC output proportional to a relative signal strength of a second RF signal if said second RF signal is being transmitted, said apparatus comprising:

a first semiconductor detector device producing a first detector current at a first detector output, said first detector current proportional to a first RF signal strength sensed while said dual frequency band transmitter is transmitting at a first frequency band;

a second semiconductor detector device producing a second detector current at a second detector output, said second detector current proportional to a second RF signal strength sensed while said dual frequency band transmitter is transmitting at a second frequency band;

a load developing resistor having a first load end and a second load end, said first load end electrically coupled to said first detector output, said first load end further electrically coupled to said second detector output, said second load end electrically coupled to provide electrical continuity, said load developing resistor converting said first detector current to a first detector voltage proportional to said first RF signal strength if said dual frequency band transmitter is transmitting at said first frequency band, said load developing resistor converting said second detector current to a second detector voltage proportional to said second RF signal strength if said dual frequency band transmitter is transmitting at said second frequency band; and a signal amplification stage having a first input terminal, a second input terminal, and an output terminal, said first input terminal electrically coupled to said first load end, said second input terminal electrically coupled to a DC reference voltage, said DC reference voltage selected to compensate for DC offset bias voltages generated by said first semiconductor detector device and said second semiconductor detector device, said output terminal providing a RF power detection device DC analog output proportional to said first RF signal strength if said dual frequency band transmitter is transmitting at said first frequency band, said output terminal providing a RF power detection device DC analog output proportional to said second RF signal strength if said dual frequency band transmitter is transmitting at said second frequency band.

7. The apparatus in accordance with claim 6 wherein said first semiconductor detector device and said second semiconductor detector device are diodes.

8. The apparatus in accordance with claim 6 wherein said first semiconductor detector device and said second semiconductor detector device are diode-connected transistors.

9. The apparatus in accordance with claim 6 further comprising an analog to digital (A/D) converter, said converter operable to convert said RF power detection device DC analog output to a digital output.

10. The apparatus in accordance with claim 6 further comprising:

a first reference semiconductor device matched to said first semiconductor detector device, said first reference semiconductor device biased to produce a first steady-state DC current approximately equal to a steady-state DC current of said first semiconductor detector device;

a second reference semiconductor device matched to said second semiconductor detector device, said second reference semiconductor device biased to produce a second steady-state DC current approximately equal to a steady-state DC current of said second semiconductor detector device;

a reference developing resistor for receiving, combining, and converting said first steady-state DC current and said second steady-state DC current into a reference voltage;

wherein said reference voltage is applied as a second input to said amplifier, said reference voltage utilized to compensate for said DC offset bias voltages.

11. The apparatus in accordance with claim 6 wherein said signal amplification stage is comprised of a first amplifier and a second amplifier, wherein said first amplifier has a first amplifier output, said first amplifier output utilized as a signal amplification stage output during a high-powered RF signal transmission, and wherein said second amplifier has a second amplifier output, said second amplifier accepting said first amplifier output as input to said second amplifier, said second amplifier output utilized as said signal amplification stage output during a low-powered RF signal transmission.

12. A temperature compensated, multiple band radio frequency (RF) signal detection circuit for detecting RF transmission signal strength at a plurality of frequency bands, said signal detection circuit comprising:

a forward biased first semiconductor detector operable to receive a first RF band transmission detection signal, said first semiconductor detector rectifying said first RF band transmission detection signal and producing a first semiconductor detector DC current, said first semiconductor detector DC current being partially comprised of a first semiconductor detector DC offset component and further being partially comprised of a first semiconductor detector analog DC component proportional to said first RF band transmission detection signal strength;

a forward biased second semiconductor detector operable to receive a second RF band transmission detection signal, said second semiconductor detector rectifying said second RF band transmission detection signal and producing a second semiconductor detector DC current, said second semiconductor detector DC current being partially comprised of a second semiconductor detector DC offset component and further being partially comprised of a second semiconductor detector analog DC component proportional to said second RF band transmission detection signal strength;

a load developing resistor having a first load end and a second load end, said first load end electrically coupled to receive said first semiconductor detector DC current and said second semiconductor detector DC current, said load developing resistor generating a power detection amplifier (PDA) signal input voltage, said PDA signal input voltage comprised of a first signal voltage, a second signal voltage, a third signal voltage, and a fourth signal voltage, said first signal voltage being a first semiconductor detector DC offset voltage, said second signal voltage being a second semiconductor detector DC offset voltage, said third signal voltage being a first semiconductor detector analog DC voltage proportional to said first RF band transmission detection signal strength, said fourth signal voltage being a second semiconductor detector analog DC voltage proportional to said second RF band transmission detection signal strength, said second load end electrically coupled to provide for electrical continuity; and an amplifier having a first input terminal, a second input terminal, and an amplifier analog DC output, said first input terminal electrically coupled to accept said PDA signal input voltage, said second input terminal electrically coupled to accept a DC reference voltage, said amplifier analog DC output proportional to said third signal voltage during a first RF band transmission, said amplifier analog DC output proportional to said fourth signal voltage during a second RF band transmission.

13. The apparatus of claim 12 further comprising a forward biased third semiconductor detector, in a parallel configuration to said first semiconductor detector and said second semiconductor detector device, operable to receive a third RF band transmission detection signal, said third semiconductor detector rectifying said third RF band transmission detection signal and producing a third semiconductor detector DC current, said third semiconductor detector DC current being partially comprised of a third semiconductor detector DC offset component and further being partially comprised of a third semiconductor detector analog DC component proportional to said third RF band transmission detection signal strength, wherein said load developing resistor is further operable to receive said third semiconductor detector DC current, said PDA signal input voltage further comprised of a fifth signal voltage and a sixth signal voltage, said fifth signal voltage being a third semiconductor detector DC offset voltage, said sixth signal voltage being a third semiconductor detector analog DC voltage proportional to said third RF band transmission detection signal strength, and wherein said amplifier analog DC output is proportional to said sixth signal voltage during a third RF band transmission.

14. The apparatus in accordance with claim 13 wherein each of a plurality of semiconductor detectors is implemented using a diode detector.

15. The apparatus in accordance with claim 13 wherein each of a plurality of semiconductor detectors is implemented using a diode-connected transistor.

16. The apparatus in accordance with claim 13 wherein said DC reference voltage is generated by a plurality of forward biased semiconductor reference devices, each of said plurality of semiconductor reference devices matched to a specific forward biased semiconductor detector, each of said forward biased semiconductor reference devices generating a current approximately equal to a DC offset current generated by a specific matched forward biased semiconductor detector.

17. An apparatus for temperature compensated radio frequency (RF) transmission signal strength detection in a dual frequency band transmitter, said apparatus providing an analog DC output proportional to a relative signal strength of a first RF signal if said first RF signal is being transmitted, said apparatus providing an analog DC output proportional to a relative signal strength of a second RF signal if said second RF signal is being transmitted, said apparatus comprising:

a forward biased first detector semiconductor for accepting and rectifying a first RF band detection signal, said first detector semiconductor generating a first steady-state DC bias current, said first detector semiconductor additionally generating a first DC signal current when said first RF band detection signal is present;

a forward biased second detector semiconductor for accepting and rectifying a second RF band detection signal, said second detector semiconductor generating a second steady-state DC bias current, said second detector semiconductor additionally generating a second DC signal current when said second RF band detection signal is present;

a load resistor operable to accept said first steady-state DC bias current, said second steady-state DC bias current, said first DC signal current, and said second DC signal current, said load resistor developing an amplifier input signal voltage proportional to current accepted;

a forward biased first reference semiconductor to provide for temperature compensation, said first reference semiconductor matched to said first detector semiconductor, said first reference semiconductor generating a third steady-state DC bias current approximately equal to said first steady-state DC bias current;

a forward biased second reference semiconductor to provide for temperature compensation, said second reference semiconductor matched to said second detector semiconductor, said second reference semiconductor generating a fourth steady-state DC bias current approximately equal to said second steady-state DC bias current;

a reference resistor accepting said third steady-state DC bias current and said fourth steady-state DC bias current, said reference resistor developing an amplifier input reference voltage proportional to current accepted; and an amplifier with a first input terminal, a second input terminal, and an output, said first input terminal accepting said amplifier input signal voltage, said second input accepting said amplifier input reference voltage, said output proportional to said first RF signal when said first RF signal is being transmitted, said output proportional to said second RF signal when said second RF signal is being transmitted.

18. The apparatus in accordance with claim 17 wherein said dual frequency band transmission comprises a cellular frequency band and a Personal Communication Services (PCS) frequency band.

19. The apparatus in accordance with claim 17 wherein said first detector semiconductor, said second detector semiconductor, said first reference semiconductor, and said second reference semiconductor are each implemented using diodes.

20. The apparatus in accordance with claim 17 wherein said first detector semiconductor, said second detector semiconductor, said first reference semiconductor, and said second reference semiconductor are each implemented utilizing diode-connected bipolar transistors.

21. The apparatus in accordance with claim 17 further comprising an analog to digital (A/D) converter, said converter operable to convert said analog DC output to a digital output.

22. The apparatus in accordance with claim 17 wherein said amplifier is implemented in stages and said amplifier output conveyed as a signal input to a modulator, said amplifier further comprising:

a first amplifier stage, said first amplifier stage implemented as a differential amplifier; and a second amplifier stage, said second amplifier stage accepting a first amplifier stage output as an input to said second amplifier stage, said second amplifier stage implemented as a non-inverting amplifier.

* * * * *